(12) United States Patent
Zou et al.

(10) Patent No.: US 12,362,575 B2
(45) Date of Patent: Jul. 15, 2025

(54) OVERVOLTAGE PROTECTION CIRCUIT AND CHARGING DEVICE

(71) Applicant: RoyPow Technology Co., Ltd., Guangdong (CN)

(72) Inventors: Quanfu Zou, Huizhou (CN); Fangzheng Kou, Huizhou (CN)

(73) Assignee: RoyPow Technology Co., Ltd., Huizhou (CN)

( * ) Notice: Subject to any disclaimer, the term of this patent is extended or adjusted under 35 U.S.C. 154(b) by 752 days.

(21) Appl. No.: 17/728,714

(22) Filed: Apr. 25, 2022

(65) Prior Publication Data

US 2023/0102569 A1     Mar. 30, 2023

(30) Foreign Application Priority Data

Sep. 30, 2021 (CN) .......................... 202111166146.X

(51) Int. Cl.
*H02J 7/00* (2006.01)
*H02J 7/04* (2006.01)
*H02M 1/42* (2007.01)
*H02M 1/44* (2007.01)
*H02M 3/335* (2006.01)
*H03K 19/14* (2006.01)

(52) U.S. Cl.
CPC ............ *H02J 7/00308* (2020.01); *H02J 7/04* (2013.01); *H02M 1/4208* (2013.01); *H02M 1/44* (2013.01); *H02M 3/335* (2013.01); *H03K 19/14* (2013.01)

(58) Field of Classification Search
CPC ........ H02J 7/00308; H02J 7/04; H02J 7/0071; H02J 7/00712; H02J 7/06; H02M 1/4208; H02M 1/44; H02M 3/335; H02M 1/0035; H02M 1/007; H02M 1/32; H02M 1/36; H02M 1/4225; H02M 3/01; H02M 3/33571; H03K 19/14

See application file for complete search history.

(56) References Cited

FOREIGN PATENT DOCUMENTS

| CN | 203313048 U | 11/2013 |
| CN | 104143920 A | 11/2014 |
| CN | 205017081 U | 2/2016 |

(Continued)

OTHER PUBLICATIONS

China National Intellectual Property Administration: Office Action of CN Application No. 202111166146.X (related application); Oct. 10, 2022; 7 pages.

(Continued)

*Primary Examiner* — David V Henze-Gongola

(57) ABSTRACT

The present disclosure relates to an overvoltage protection circuit and a charging device. A voltage applied to a PFC power supply on an input side is collected through an input voltage sampling circuit and an amplifier circuit, and a data processing capability of a charging management circuit is used to determine whether the applied voltage exceeds a preset voltage threshold. The preset voltage threshold refers to a voltage that is not greater than a minimum withstand voltage of an input device of the charger. The power factor correction power supply is controlled to operate to charge the battery to be charged when it is determined that the voltage applied does not exceed the preset voltage threshold, to prevent damage to the input device due to a connection to two phases of voltage.

10 Claims, 15 Drawing Sheets

(56) References Cited

FOREIGN PATENT DOCUMENTS

| CN | 106059322 | A |   | 10/2016 |         |           |
|----|-----------|---|---|---------|---------|-----------|
| CN | 207705877 | U |   | 8/2018  |         |           |
| CN | 111884516 | A |   | 11/2020 |         |           |
| CN | 112091369 | A | * | 12/2020 | ……… | B23K 9/1056 |
| CN | 213782946 | U | * | 7/2021  |         |           |

OTHER PUBLICATIONS

China National Intellectual Property Administration: Office Action of CN Application No. 202111166146.X (related application); Jul. 13, 2022; 8 pages.

\* cited by examiner

OVERVOLTAGE PROTECTION CIRCUIT AND CHARGING DEVICE

CROSS-REFERENCE TO RELATED APPLICATIONS

This application claims priority to and/or benefit of Chinese No. 202111166146X, filed Sep. 30, 2021, entitled OVERVOLTAGE PROTECTION CIRCUIT AND CHARGING DEVICE, the specification of which is incorporated by reference herein in its entirety.

TECHNICAL FIELD

The present disclosure relates to a field of charging safety technology, and particularly to an overvoltage protection circuit and a charging device.

BACKGROUND

At present, most of the chargers use soft start technology. A capacitor in a Power Factor Correction (PFC) circuit is connected with a relay in parallel through a resistor. After charging the capacitor to a certain level, the relay is then turned on, and the system starts to work. When the single-phase power input is 300V, the PFC capacitor can be charged to 420V, which is not greater than the 420V withstand voltage of the capacitor. However, in particular operating conditions, if two phases of the three-phase power are connected to the charger, the capacitor will still be charged through the resistor. At this time, however, the capacitor can be charged to 537V, which is greater than the 450V withstand voltage of the bus capacitor, thereby causing overvoltage damage to the bus capacitor and system failure.

Further, since the withstand voltage of the input device is generally smaller than 300VAC, the connection of the two phases of the power to the charger will cause the overvoltage damage to the input EMI circuit device.

SUMMARY

In view of the above, it is necessary to provide an overvoltage protection circuit and a charging device, which can effectively avoid damage to the device caused by overvoltage during charging, so as to improve charging reliability and service life.

In an aspect, an overvoltage protection circuit, which is applied to a charger, is provided by an embodiment of the present disclosure. The overvoltage protection circuit includes:
  an input voltage sampling circuit, an input end of the input voltage sampling circuit being configured to be connected in parallel to an input end of a power factor correction power supply of the charger, and the input end of the power factor correction power supply being further configured to be connected to a power supply for converting a voltage of the power supply to a charging voltage for charging battery to be charged;
  an amplifier circuit, an input end of the amplifier circuit being connected to an output end of the input voltage sampling circuit;
  a charging management circuit, a sampling end of the charging management circuit being connected to an output end of the amplifier circuit, and the charging management circuit being configured to control the power factor correction power supply to operate when it is detected that a voltage output by the amplifier circuit is smaller than or equal to a preset voltage threshold, and
  a logic device power supply, connected to the voltage sampling circuit, the amplifier circuit, and the charging management circuit, respectively, and configured to supply an operating voltage to the voltage sampling circuit, the amplifier circuit, and the charging management circuit.

The overvoltage protection circuit provided by the embodiment of the present disclosure is applied to a charger. The voltage applied to the PFC power supply on a bus side is collected through the input voltage sampling circuit and the amplifier circuit. By using the data processing capability of the charging management circuit, it is determined whether the applied voltage exceeds a preset voltage threshold. The preset voltage threshold refers to a voltage that is not greater than the minimum withstand voltage of the input device of the charger. The power factor correction power supply is controlled to operate to charge the battery to be charged only when it is determined that the voltage applied does not exceed the preset voltage threshold, to prevent damage to the input devices due to the connection to two phases of voltage, and the protection for the PFC capacitor and input EMI devices is achieved, thereby improving the working reliability and service life of the charger.

In an embodiment, the overvoltage protection circuit further includes:
  a first switch, an input end of the first switch being configured to be connected to the power supply, and an output end of the first switch being configured to be connected to the power factor correction power supply, and
  a first startup circuit, a controlled end of the first startup circuit being connected to a first delayed startup control end of the charging management circuit, and a control end of the first startup circuit being connected to a controlled end of the first switch;
  the charging management circuit is configured to, when it is detected that the voltage output by the amplifier circuit is smaller than or equal to the preset voltage threshold, output a signal from the first delayed startup control end to drive the first startup circuit to control the first switch to be turned on, causing the power factor correction power supply to convert the voltage of the power supply to the charging voltage for charging the battery to be charged.

In an embodiment, the first switch is a relay, and the first startup circuit includes a first transistor;
  a base of the first transistor is connected to the first delayed startup control end of the charging management circuit, a collector of the first transistor is connected to an end of a coil of the first switch, an emitter of the first transistor is grounded, and another end of the coil of the first switch which is not connected to the first transistor is connected to the logic device power supply.

In an embodiment, the overvoltage protection circuit further includes a second startup circuit;
  a controlled end of the second startup circuit is connected to a first power operation control end of the charging management circuit, and a control end of the second startup circuit is connected to an operation state control end of the power factor correction power supply;
  the charging management circuit is further configured to, when it is detected that the voltage output by the amplifier circuit is smaller than or equal to a preset voltage threshold, output a signal from the first power operation control end to drive the power factor correction power supply to operate, causing the power factor correction power supply to convert the voltage of the power supply to the charging voltage for charging the battery to be charged.

In an embodiment, the second startup circuit comprises a first optical coupler;
- a cathode of a light emitter of the first optical coupler is connected to the first power operation control end of the charging management circuit, and an anode of the light emitter is connected to the logic device power supply;
- an end of a light receiver of the first optical coupler is connected to the logic device power supply, and another end of the light receiver of the first optical coupler is configured to be connected to the operation state control end of the power factor correction power supply;
- the charging management circuit is further configured to, when it is detected that the voltage output by the amplifier circuit is smaller than or equal to the preset voltage threshold, output a signal from the first power operation control end to drive the light emitter of the first optical coupler to emit light, and the light receiver of the first optical coupler outputs current to the operation state control end of the power factor correction power supply under an optical coupling function so as to trigger the power factor correction power supply to output a charging voltage to the battery to be charged.

In an embodiment, the overvoltage protection circuit further includes:
- a capacitive reactance matching capacitor, connected in parallel at both ends of the first switch, and configured to achieve capacitive reactance matching and voltage division with a capacitor at an output end of the power factor correction power supply.

In the overvoltage protection circuit provided by an embodiment of the present disclosure, the input voltage is divided by connecting the capacitive reactance matching capacitor in parallel at both ends of the first switch. The capacitive reactance matching capacitor achieves capacitive reactance matching and voltage division with the capacitor at the output end of the power factor correction power supply. Thus, the voltage of the capacitor at the output end of the power factor correction power supply is controlled within a safe voltage to prevent the charger from failing due to the charging voltage of the capacitor exceeding withstand voltage thereof.

In an embodiment, the overvoltage protection circuit further includes an input rectification filter circuit;
- an input end of the input rectification filter circuit is connected to the output end of the first switch, and an output end of the input rectification filter circuit is configured to be connected to the output end of the power factor correction power supply.

In an embodiment, the overvoltage protection circuit further includes an electromagnetic interference filter;
- an input end of the electromagnetic interference filter is connected to the output end of the first switch, and an output end of the electromagnetic interference filter is connected to the input end of the input rectification filter circuit.

In another aspect, a charging device including the above overvoltage protection circuit and a charger is provided;
the charger includes:
the power factor correction power supply, the input end of the power factor correction power supply being configured to be connected to the power supply, and an output end of the power factor correction power supply being connected to the battery to be charged, and the power factor correction power supply being configured to convert the voltage of the power supply to a charging voltage for charging the battery to be charged.

In an embodiment, the charger further includes:
a LLC half-bridge resonant power supply, an input end of the LLC half-bridge resonant power supply being configured to be connected to the output end of the power factor correction power supply, and an output end of the LLC half-bridge resonant power supply is connected to an input end of a second switch in the normally open state, and a charging interface, configured to be connected to the battery to be charged, and provided with a positive-and-negative-pole pin, an engage-enabled pin, and a charge-enabled pin, a length of the charge-enabled pin being smaller than the length of the positive-and-negative-pole pin and the engage-enabled pin, respectively, a set of ends of the positive-and-negative-pole pin being connected to a pair of output ends of the second switch correspondingly, and another set of ends of the positive-and-negative-pole pin being configured to be connected to the positive and negative poles of the battery to be charged correspondingly;

an first end of the charging management circuit is connected to an end of the engage-enabled pin, a second end of the charging management circuit is connected to an end of the charge-enabled pin, a third end of the charging management circuit is connected to a controlled end of the second switch, and a fourth end of the charging management circuit is connected to a burst mode operation threshold setting end of the LLC half-bridge resonant power supply;

the charging management circuit is further configured to, during a process of plugging the charging interface into the battery to be charged, control the LLC half-bridge resonant power supply to soft start when the battery to be charged is in contact with the engage-enabled pin, and control the second switch to be turned on to make the LLC half-bridge resonant power supply to charge the battery to be charged when the other end of the charge-enabled pin of the charging interface is in contact with the battery to be charged;

the charging management circuit is further configured to, during a process of unplugging the charging interface from the charging battery, when the charge-enabled pin is disconnected from the battery to be charged, control a primary side of the LLC half-bridge resonant power supply to stop operating.

BRIEF DESCRIPTION OF THE DRAWINGS

To illustrate the technical solution in the embodiments of the present disclosure or related art more clearly, the accompanying drawings for describing the embodiments or the prior art are introduced briefly in the following. Apparently, the accompanying drawings in the following description only represent some embodiments of the present disclosure, and persons of ordinary skill in the art can derive other drawings from the accompanying drawings without creative efforts.

FIG. 2b is a circuit diagram of an input rectification filter circuit and a portion between the input rectification filter circuit and the power supply in FIG. 2a;

DETAILED DESCRIPTION

Figure 1:
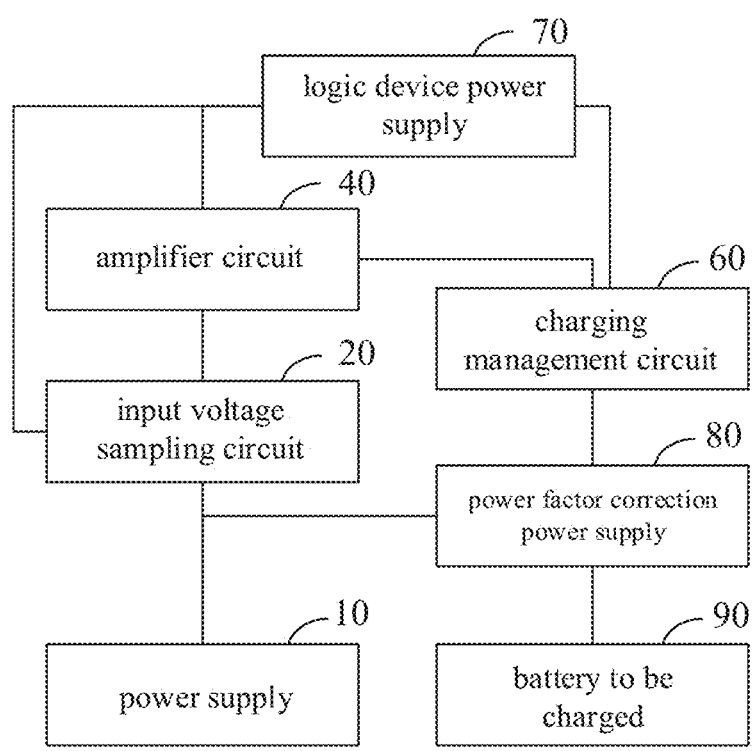
FIG. 1 is a schematic diagram of an overvoltage protection circuit according to an embodiment.

In order to facilitate the understanding of the present disclosure, a more comprehensive description of the present disclosure will be made with reference to the relevant drawings in the followings. The embodiments of the present disclosure are shown in the drawings. However, the present disclosure can be implemented in many different forms, and is not limited to the embodiments described herein. On the contrary, the purpose of providing these examples is to make the disclosure more thorough and comprehensive.

Unless otherwise specified, all the technical and scientific terms used herein have the same meaning as commonly understood by those skilled in the technical field of the present disclosure. The terminology used in the specification of the present disclosure herein is only for the purpose of describing specific embodiments, and is not intended to limit the present disclosure.

It can be understood that the terms "first", "second" and the like used in the present disclosure can be used herein to describe various elements, and these elements are not limited by these terms. These terms are only used to distinguish the first element from another element. For example, without departing from the scope of the present disclosure, a first resistance may be referred to as a second resistance, and similarly, the second resistance may be referred to as the first resistance. Both the first resistor and the second resistor are resistors, but they are not the same resistor.

It can be understood that the "connection" in the following embodiments should be understood as "electrical connection", "communication connection", etc. if the connected circuit, module, unit and the like has the transmission of electrical signal or data between each other.

The singular forms of "a", "an", and "the" can also include plural forms when they are used herein, unless otherwise specified clearly in the context. It should be also be understood that the terms "include/comprise" or "have/has" and the like specify the existence of the stated features, wholes, steps, operations, components, parts or their combinations, but do not exclude the possibility of the existence or addition of one or more other features, wholes, steps, operations, components, parts or their combinations.

To address the problem specified in the background, in an embodiment, an overvoltage protection circuit applied to a charger is provided by an embodiment of the present disclosure. As shown in FIG. 1, the overvoltage protection circuit includes an input voltage sampling circuit 20, an amplifier circuit 40, a charging management circuit 60, and a logic device power supply 7010. An input end of the input voltage sampling circuit 20 is configured to be connected in parallel to an input end of a power factor correction power supply of the charger, and the input end of the power factor correction power supply is also configured to be connected to a power supply 10 for converting the voltage of the power supply 10 into a charging voltage to supply power to the battery 90 to be charged. An input end of the amplifier circuit 40 is connected to an output end of the input voltage sampling circuit 20. A sampling end of the charging management circuit 60 is connected to an output end of the amplifier circuit 40. The charging management circuit 60 is configured to control the power factor correction power supply to operate when it is detected that the voltage output by the amplifier circuit 40 is smaller than or equal to a preset voltage threshold. The logic device power supply 7010 is respectively connected to the voltage sampling circuit, the amplifier circuit 40, and the charging management circuit 60, and is configured to supply an operating voltage to the voltage sampling circuit, the amplifier circuit 40, and the charging management circuit 60.

Figure 2A:
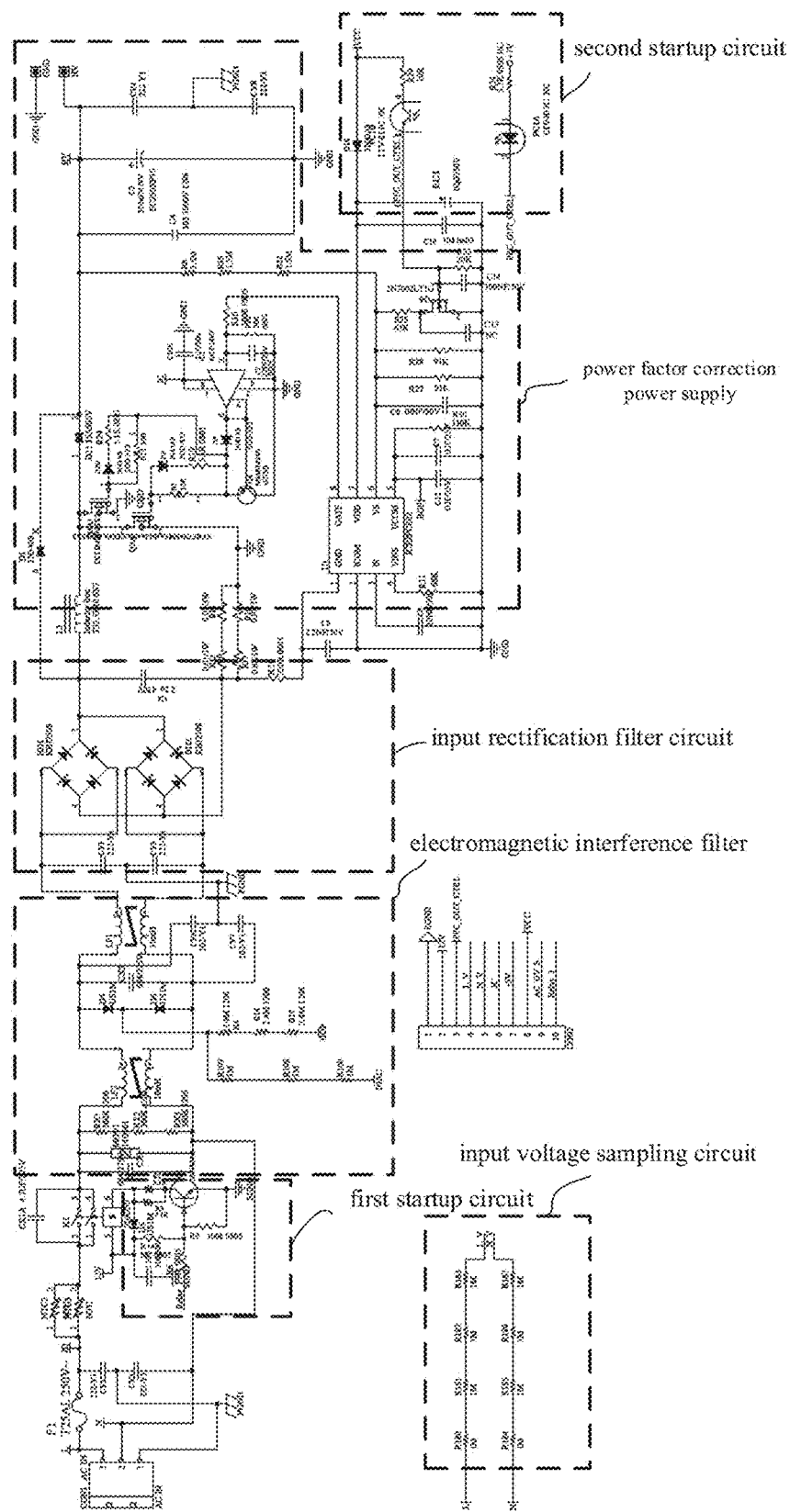
FIG. 2a is a schematic diagram of a connection relationship of a power factor correction power supply and a power supply in the overvoltage protection circuit, and a schematic diagram of a first switch, a first startup circuit, and a second startup circuit, according to another embodiment.
Figure 3:
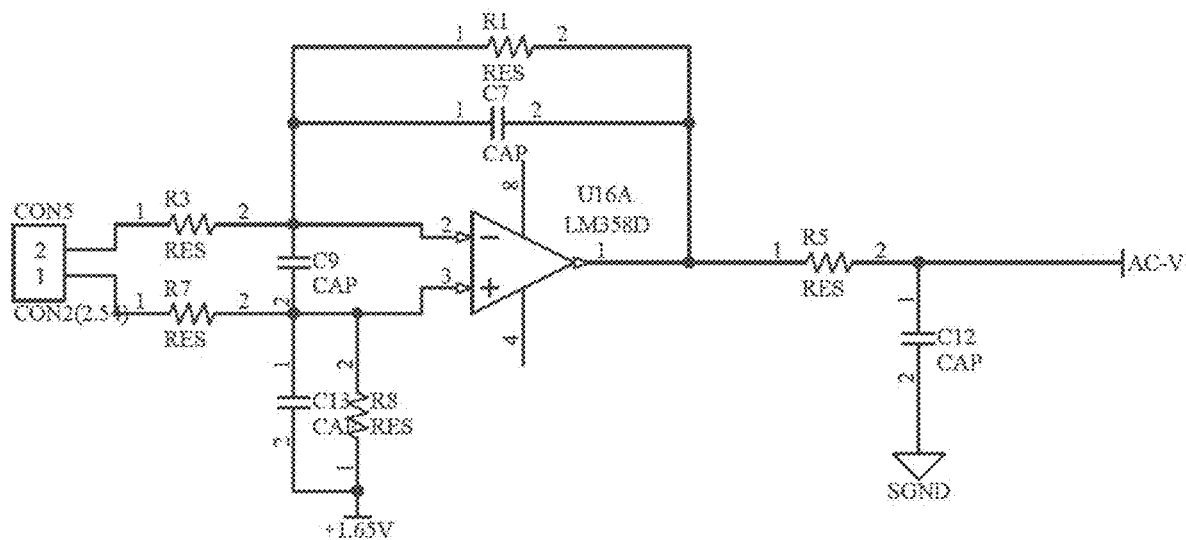
FIG. 3 is a schematic diagram of module structure of an amplifier circuit in FIG. 1.
Figure 4:
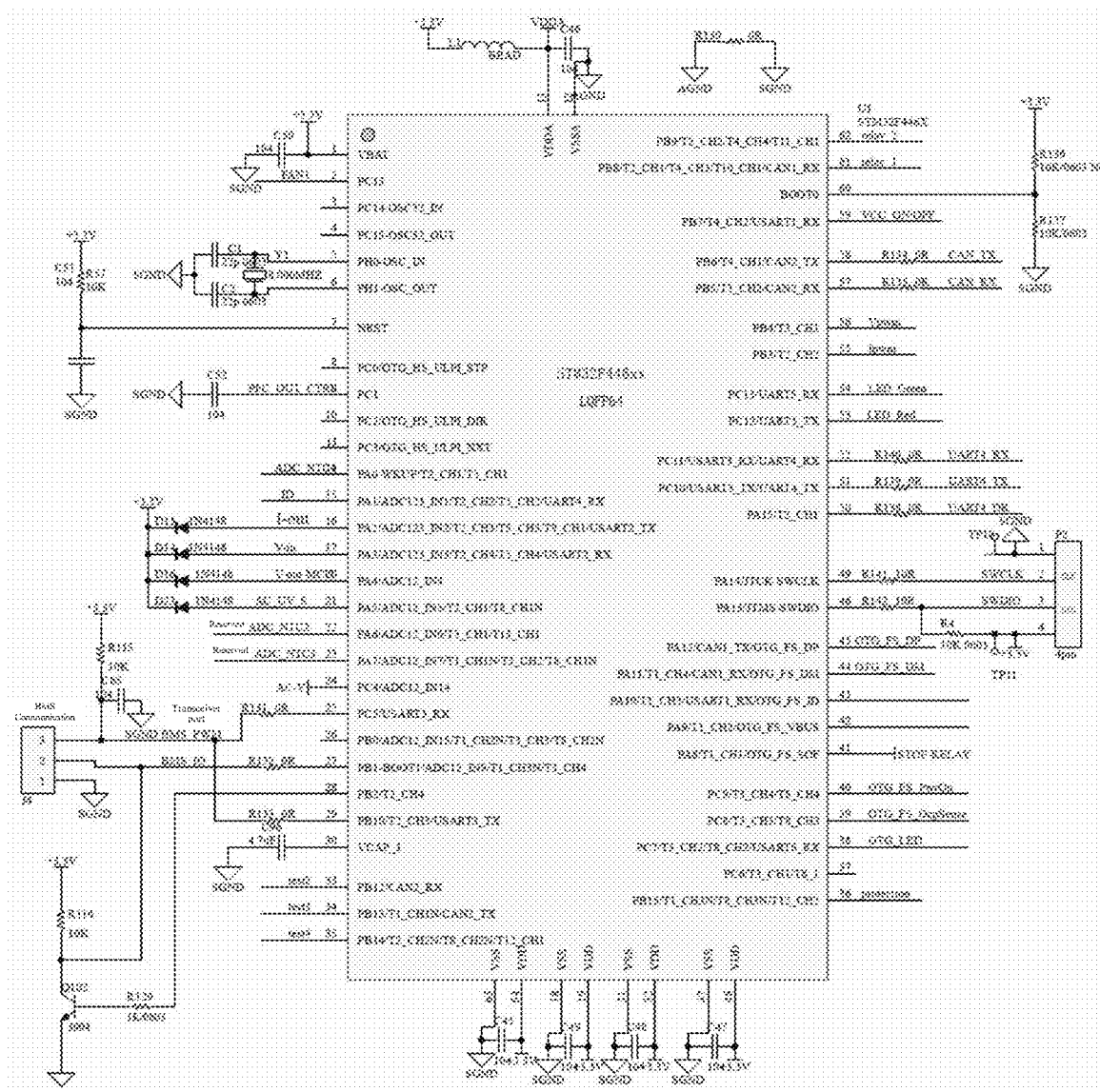
FIG. 4 is a schematic diagram of a charging management circuit according to a specific embodiment.

The power supply 10 refers to an external power supply, such as a 220V AC mains supply, etc. The input voltage sampling circuit 20 refers to a circuit capable of collecting data characterizing the voltage magnitude of the power supply 10 loaded on the input end of the power factor correction power supply. For example, the input voltage sampling circuit 20 may include resistors R180 to R187 connected in parallel between an L end and an N end as shown in FIG. 2 to achieve voltage sampling, and the sampled voltage can be connected to the input end of the amplifier circuit 40 through an interface CONS. The interface connection manner is convenient for operation and the efficiency of the circuit connection is improved. For the implementation of the amplifier circuit 40, a circuit shown in FIG. 3 can also be used to implement the amplifier circuit 40. However, the structure of the amplifier circuit 40 is not limited to the structure shown in FIG. 3. In order to better illustrate the implementation process of the overvoltage protection circuit provided by the embodiment of the present disclosure, specific structures shown in FIGS. 2 to 4 are taken as examples for description.

An output end of the power factor correction power supply can be connected to the battery 90 to be charged after each part is connected according to the figures, and the battery is intended to be charged. At this time, as shown in FIG. 2a and FIG. 2d, the AC voltage of the power supply 10 connected to the input side of the power factor correction power supply is current limited by a resistor group composed by the resistors R180 to R187, and then input to the positive and negative input ends of the amplifier circuit 40 in two branches. After amplified by the amplifier circuit 40, the amplified voltage is output to the 24-th pin of the charging management circuit 60 of the FIG. 4 by an pin AC-V of the amplifier circuit 40 in FIG. 3. Chips of STM32 series as shown in FIG. 4 can be used as the charging management circuit 60, and whether the amplified voltage is smaller than or equal to the preset voltage threshold is determined according to its software processing capability. The preset voltage threshold refers to the value of the voltage output by the corresponding amplifier circuit 40 when the voltage applied to the input side of the power factor correction power supply does not exceed the minimum device withstand voltage of the input side. That is, when the voltage sampled by the pin AC-V is smaller than or equal to the preset voltage threshold, since the voltage is not greater than the withstand voltage of an anti-EMI (electromagnetic interference) devices of the input side, it can be determined that the voltage applied to the input side of the power factor correction power supply will not cause damage to the devices. At this time, the charging management circuit 60 controls the power factor correction power supply to operate for voltage conversion to provide the battery 90 to be charged with a stable power source.

According to the overvoltage protection circuit provided by the embodiment of the present disclosure, the voltage applied to the PFC power supply on a bus side is collected through the input voltage sampling circuit 20 and the amplifier circuit 40. By using the data processing capability of the charging management circuit 60, the power factor correction power supply is controlled to operate to charge the battery to be charged only when it is determined that the voltage applied to the PFC power supply does not exceed the preset voltage threshold, to prevent damage to the input devices due to a connection to two phases of voltage, and the protection for the PFC capacitor and input EMI devices is achieved, thereby improving the working reliability and service life of the charger.

Figure 2B:
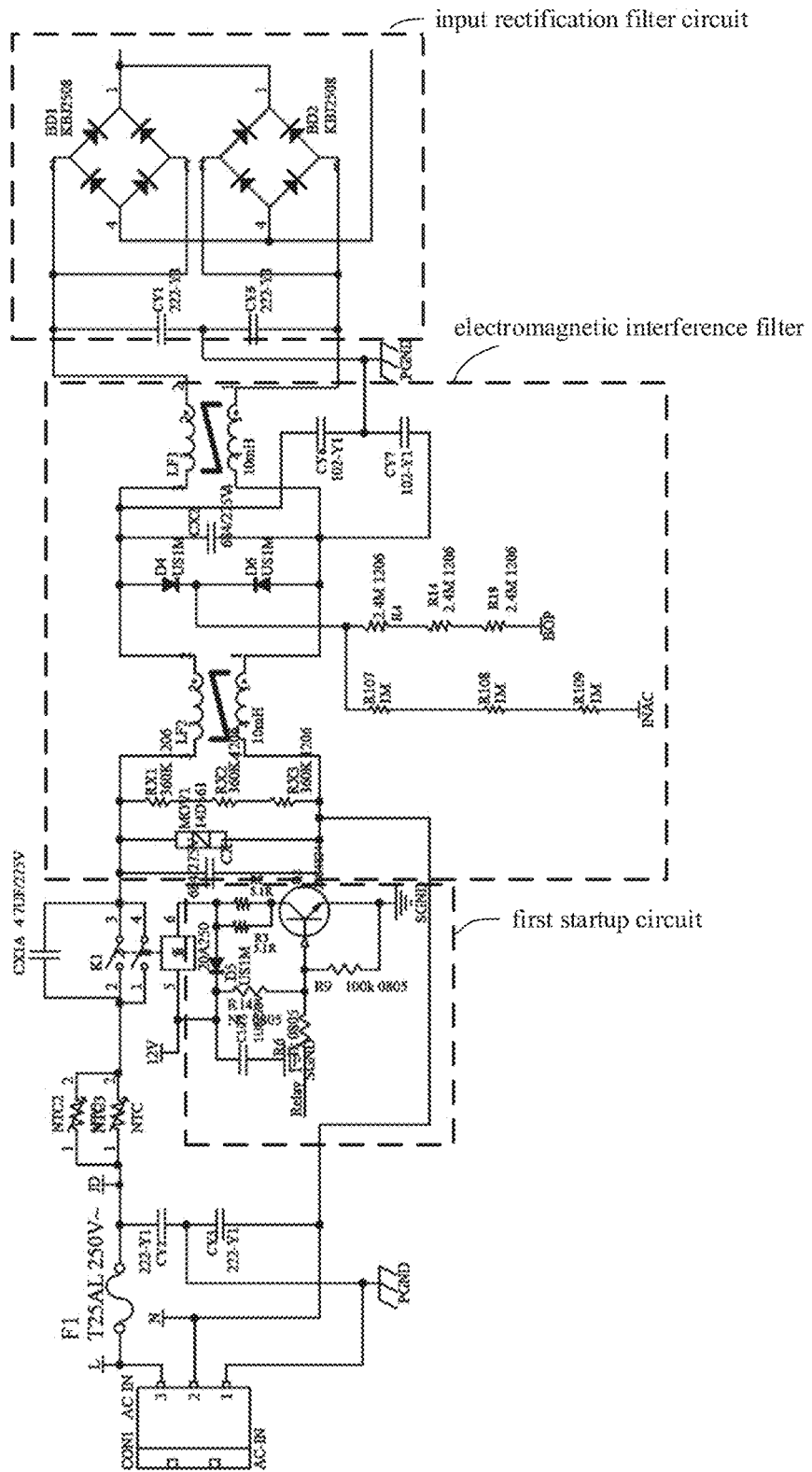

In an embodiment, as shown in FIG. 2a and FIG. 2b, controlling the power factor correction power supply to operate by the charging management circuit 60 can be implemented by providing a first switch K1 and a first startup circuit 100 in the voltage protection circuit. An input end of the first switch K1 is configured to be connected to the power supply 10, and an output end of the first switch K1 is configured to be connected the power factor correction power supply. In an initial state, the first switch K1 is in an off state, and the power supply 10 in front of the first switch K1 cannot flow current into the power factor correction power supply. The on/off state of the first switch K1 is controlled by the first startup circuit 100. A controlled end of the first startup circuit 100 is connected to a first delayed startup control end of the charging management circuit 60, and a control end of the first startup circuit 100 is connected to a controlled end of the first switch K1. The first delayed startup control end (for example, an end relay_1 in the configuration of FIG. 4) outputs a signal to drive the first startup circuit 100 to control the first switch K1 to be turned on when the charging management circuit 60 determines that the voltage output by the amplifier circuit 40 is smaller than or equal to the preset voltage threshold according to the voltage obtained from the amplifier circuit 40, and the connection path between the power supply 10 and the power factor correction power supply is connected, so that the power factor correction power supply converts the voltage of the power supply 10 into a charging voltage to charge the battery 90 to be charged. By this circuit design, the damage to the devices of the input side caused by the excessive voltage applied to the input side can be effectively avoided, thereby improving the service life and safety of the charger.

In an embodiment, in addition to the processing chip (the processing chip can be a microcontroller of model STM32F446xx) shown in FIG. 4, the charging management circuit 60 can also include devices connected to other pins of the STM32F446xx as shown in FIG. 4, which ensures the clock signal required by the operation of the STM32F446xx to make it operate normally. The function of the resistors, capacitors and other devices connected to each pin of the STM32 series chips can be reasonably understood according to the manual of the STM32 series chips, which is not repeated here.

In an embodiment, the first switch K1 is a relay, and the first startup circuit includes a first transistor Q2. A base of the first transistor Q2 is connected to the first delayed startup control end of the charging management circuit 60, and a collector of the first transistor Q2 is connected to a coil of the first switch K1. An emitter of the first transistor Q2 is grounded, and an end of the coil of the first switch that is not connected to the first transistor Q2 is connected to the logic device power supply 7010.

As shown in FIG. 2a and FIG. 2b, the base of the first transistor Q2 (Ralay_1) is connected to the first delayed startup control end relay_1 of the charging management circuit 60 in FIG. 4, and they can be quickly connected by a multi-pin wiring terminal. When the charging management circuit 60 determines that the voltage output by the amplifier circuit 40 is smaller than or equal to the preset voltage threshold according to the voltage obtained from the amplifier circuit 40, the end relay_1 outputs high level, which triggers the first transistor to be turned on. The coil of the first switch K1 is triggered to operate by a 12V voltage to which the logic device power supply 7010 is applied, so that the first switch K1 is turned on. At this time, the input voltage of the power supply 10 is transmitted to the input side of the power factor correction power supply through the first switch K1. After being processed by the power factor correction power supply, a stable DC voltage is output to charge the battery 90 to be charged.

In addition to the first transistor Q2, the first startup circuit may further includes a resistor R2, a resistor R3, a resistor R6, and a resistor R9 as shown in FIG. 2b, and they are connected to the ends of the first transistor Q2 respectively according to the connection relationship as shown in the figures. The first transistor Q2 here is not limited to the NPN transistor as shown in FIG. 2b, and it can also be MOS transistor (Metal-Oxide-Semiconductor Field-Effect Transistor). The transistors that can be turned on when the end relay_1 outputs high level are within the scope of the present disclosure, and the first transistor can also be a composite transistor. As shown in FIG. 2b, the first startup circuit can further include a capacitor C107 and a diode D5, which are connected according to the connection relationship shown in FIG. 2b to improve the operation stability of the first transistor.

Figure 2C:
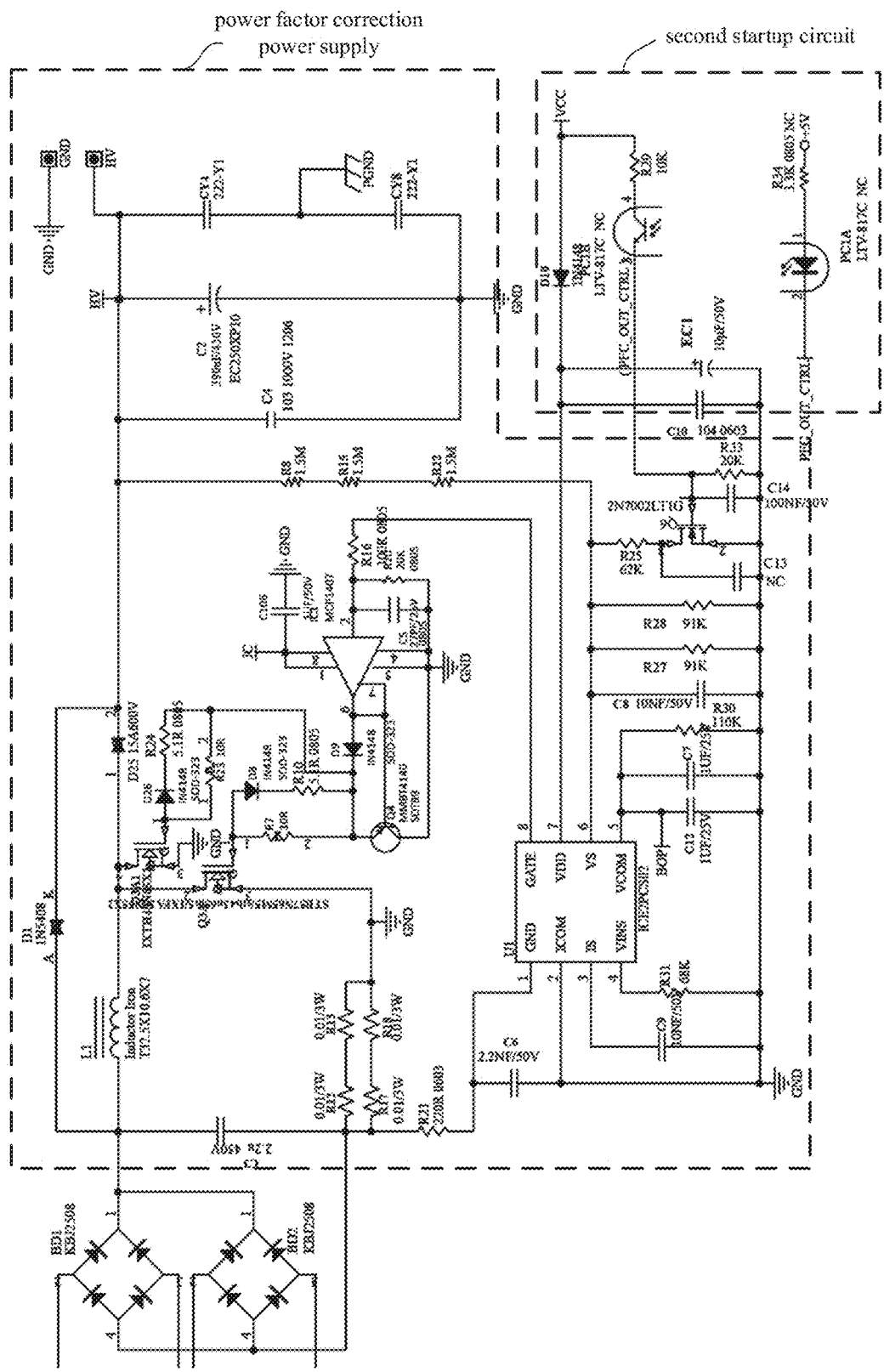
FIG. 2c is a circuit diagram of a portion between an input rectification filter circuit and a power factor correction power supply in FIG. 2a, including a schematic diagram of a second startup circuit.
Figure 2D:
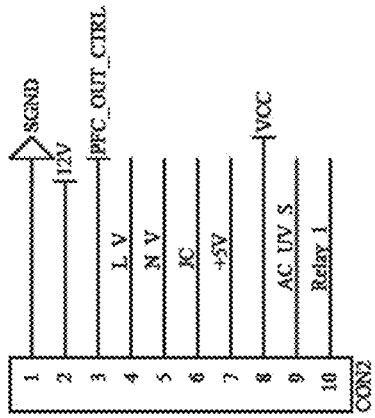
FIG. 2d is a schematic diagram of an input voltage sampling circuit in FIG. 2a and a port CON2 through which the charging management circuit is connected respectively to the second startup circuit and the first startup circuit.
Figure 2D:
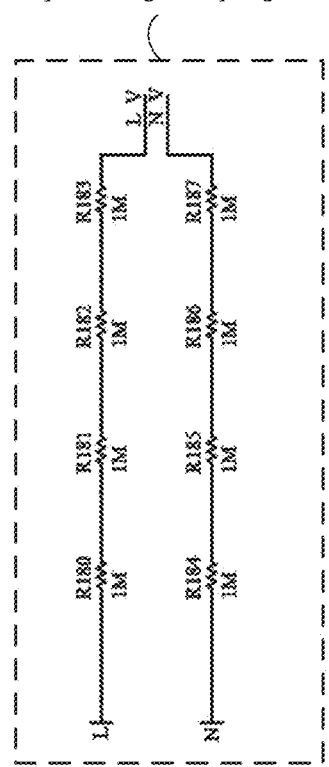

In an embodiment, as shown in FIG. 2a and FIG. 2c, the overvoltage protection circuit further includes a second startup circuit. A controlled end of the second startup circuit is connected to a first power operation control end of the charging management circuit 60, and a control end of the second startup circuit is connected to an operation state control end of the power factor correction power supply. The charging management circuit 60 is further configured to, when it is detected that the voltage output by the amplifier circuit 40 is smaller than or equal to the preset voltage threshold, output a signal from the first power operation control end to drive the power factor correction power supply to operate, which converts the voltage of the power supply 10 to a charging voltage to charge the battery 90 to be charged. The power factor correction power supply is triggered to operate by the determination of detecting that the voltage output by the amplifier circuit 40 is smaller than or equal to the preset voltage threshold. In combination with the determination result above, the control of controlling the first switch to be turned on is achieved, which can not only ensure that charging process is started when the voltage of the input side is not greater than withstand voltage of the device of the input side, and a soft start control can be achieved, which is beneficial to improve the charging reliability and stability of the charger.

In an embodiment, as shown in FIG. 2c, the second startup circuit may include a first optical coupler PC1. A cathode of a light emitter PC1A of the first optical coupler is connected to the first power operation control end of the charging management circuit 60, and an anode of the light emitter PC1A is connected to the logic device power supply 7010. An end of a light receiver PC1B of the first optical coupler is connected to the logic device power supply 7010, and another end of the light receiver PC1B of the first optical coupler is connected to the operation state control end of the power factor correction power supply. The charging management circuit 60 is further configured to, when it is detected that the voltage output by the amplifier circuit 40 is smaller than or equal to the preset voltage threshold, output a signal from the first power operation control end to drive the light emitter of the first optical coupler to emit light. The light receiver of the first optical coupler outputs current to the operation state control end of the power factor correction power supply under the optical coupling function so as to trigger the power factor correction power supply to output a charging voltage to the battery 90 to be charged.

As shown in FIG. 2c, the anode of the light emitter can be connected to a +5V voltage output end of the logic device power supply 7010 by being connected in series with a pull-up resistor R34. A connecting end 4 of the light receiver PC1B can be connected to a VCC voltage output end of the logic device power supply 7010 through a pull-up resistor R29. A connecting end 3 of the light receiver PC1B can be connected to a gate of a MOS transistor Q6, and an emitter of Q6 is connected to a pin VS of a power factor correction control chip ICE2PCS02. The chip ICE2PCS02 is triggered to operate to achieve the power factor correction when the light receiver PC1B receives light. The other part of the power factor correction power supply can be implemented by referring to the hardware connection shown in FIG. 2c, and the corresponding hardware parameters can be selected. For example, the diode D1 in FIG. 2c is used as a protection diode, which can not only accelerate the charging process of the subsequent connected capacitor, but also protect each switch diode/transistor in the protection PFC power supply. The diode D25 in the figure is a fast recovery diode. The input surge current can be limited by an inductor 1. The beneficial effects of each part can be reasonably deduced according to the manual of the chip ICE2PCS02 and the connection relationship given by FIG. 2c, which is not repeated here.

In an embodiment, the overvoltage protection circuit further includes a capacitive reactance matching capacitor CX1A. The capacitive reactance matching capacitor CX1A is connected in parallel at both ends of the first switch, and is configured to achieve capacitive reactance matching and voltage division with the capacitor at the output end of the power factor correction power supply.

According to the overvoltage protection circuit provided by the embodiment of the present disclosure, the capacitive reactance matching capacitor CX1A is connected in parallel at both ends of the first switch K1. The capacitive reactance matching capacitor CX1A achieves capacitive reactance matching and voltage division with the capacitor at the output end of the power factor correction power supply, and the voltage of the input side is divided. Thus, the voltage of the capacitor at the output end of the power factor correction power supply is controlled within a safe voltage to prevent the charger from failing due to the charging voltage of the capacitor exceeding the withstand voltage thereof. When the input side is connected to the power supply 10, the capacitive reactance matching capacitor CX1A achieves capacitive reactance matching and voltage division with the capacitors C1 and C2 of the power factor correction power supply (PFC power supply), so that the voltage of the input side is divided, and thus the voltage of the capacitor at the PFC power supply is controlled within a safe voltage.

In an embodiment, as shown in FIG. 2a and FIG. 2b, the overvoltage protection circuit further includes an input rectification filter circuit. An input end of the input rectification filter circuit is connected to the output end of the first switch K1, and an output end of the input rectification filter circuit is configured to be connected the output end of the power factor correction power supply. The input rectification filter circuit may include rectifier bridges BD1 and BD2 as shown in FIG. 2b. The input side of the PFC power supply may be connected to a high-frequency bypass filter capacitor C3. The DC voltage rectified by the rectifier bridge is filtered and then current limited by an inductor L1, and then applies on each transistor connected to an operational amplifier IC1. The specific connection relationship is shown in FIG. 2b. An input end of the operational amplifier is connected to a pin GATE of the chip ICE2PCS02 and is controlled by this chip. The charging management circuit 60, when it is detected that the voltage output by the amplifier circuit 40 is smaller than or equal to the preset voltage threshold, output a signal from the first power operation control end to drive the light emitter of the first optical coupler to emit light. The light receiver of the first optical coupler outputs current to the operation state control end VS of the power factor correction power supply under the optical coupling function so as to cause the chip ICE2PCS02 to perform power factor correction. The capacitor C1, a capacitor C1A, the capacitor C2, and a capacitor C2A are charged through a resistor R8, a resistor R15, a resistor R22, and the diode D1 to provide a stable voltage HV, which can charge the battery 90 to be charged.

In an embodiment, as shown in FIG. 2a and FIG. 2b, the overvoltage circuit further includes an electromagnetic interference filter. An input end of the electromagnetic interference filter is connected to the output end of the first switch, and an output end of the electromagnetic interference filter is connected to the input end of the input rectification filter circuit.

As shown in FIG. 2b, the electromagnetic interference filter can include two common mode chokes LF1 and LF2, which are cooperated with other resistors and capacitors shown in FIG. 2b to achieve electromagnetic interference (EMI) suppression on the input side.

Figure 5:
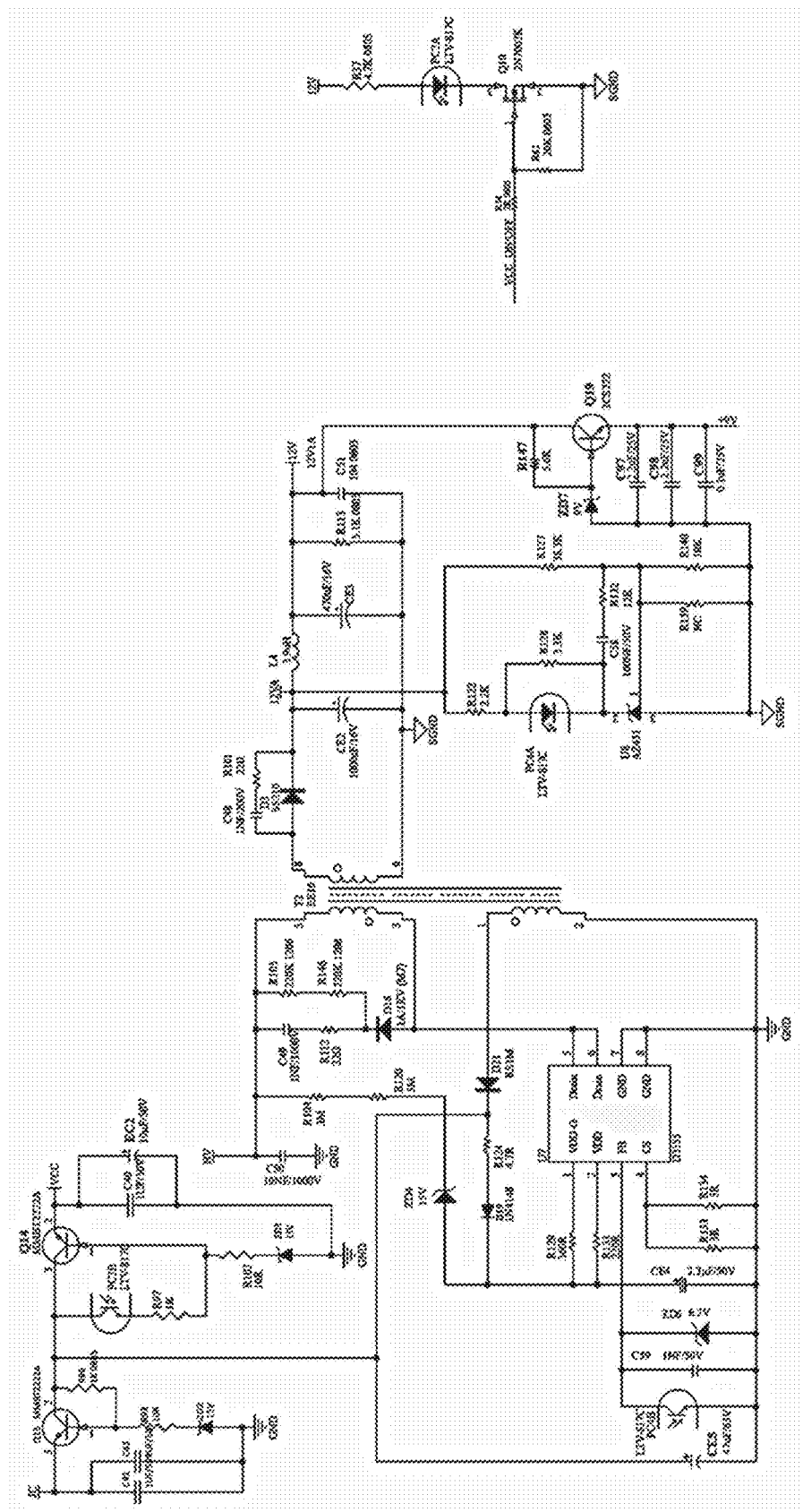
FIG. 5 is a schematic diagram of a logic device power supply according to an embodiment.
Figure 6:
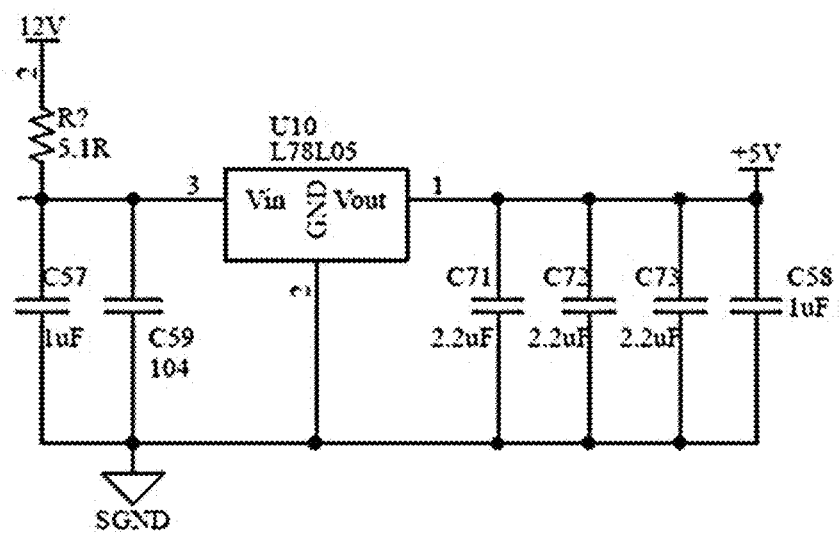
FIG. 6 a schematic diagram of a voltage conversion circuit for converting a 12V voltage output by the logic device power supply in FIG. 5 into 5V and 3.3V according to an embodiment.
Figure 6:
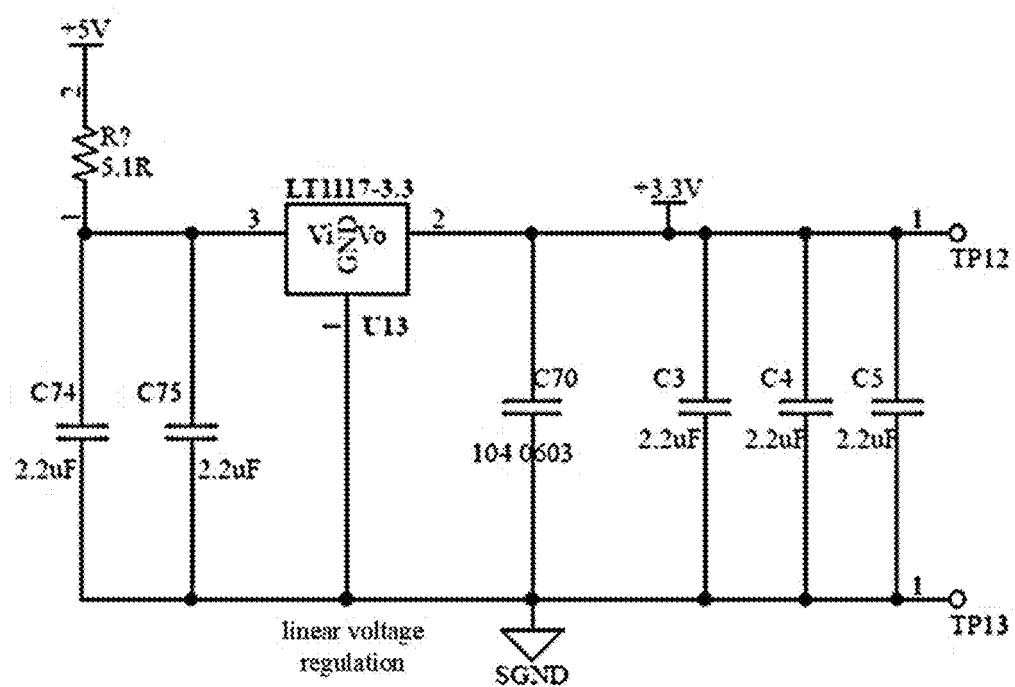
Figure 7:
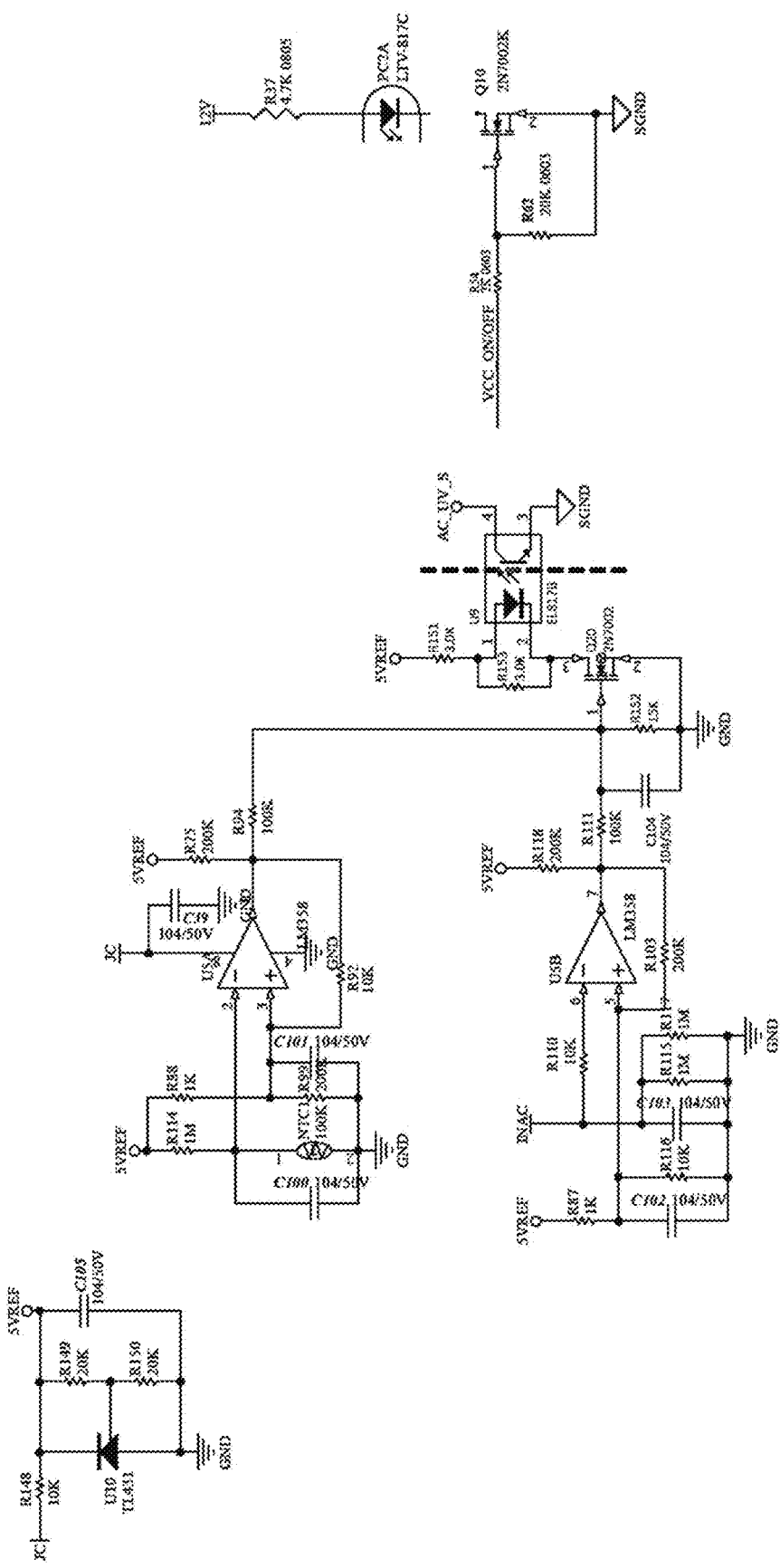
FIG. 7 is a sampling circuit of the charging management circuit for sampling an operating condition of an electromagnetic interference filter circuit according to an embodiment.

In an embodiment, as shown in FIG. 5, the output end of the logic device power supply 70 is connected respectively to an LLC half-bridge resonant power supply 120 and the charging management circuit 60. The logic device power supply 70 is configured to convert the output voltage of the power factor correction power supply to an operating voltage applicable for the LLC half-bridge resonant power supply 120 and the charging management circuit 60. A power management chip D3555 shown in FIG. 5 can be used to achieve that the voltage HV output by the power factor correction power supply is output to a voltage of 5VREF, 12VA, 12V, and +9V after being managed by the power management chip U7 (D3555), for providing the operating voltage shown in the figures to each logic device in each figure, so as to cause each device to operate normally. In addition, in the logic device power supply 70, a second optical coupler (a light emitter PC4A and a light receiver PC4B) as shown in FIG. 5 is also used to achieve output feedback, which is beneficial for the chip U7 to adjust the output signal of the pin Drain according to the feedback signal feedback by a feedback pin FB of the chip U7, thereby providing a stable 12VA signal, and in turn providing a stable 12V and +9V voltage. Similarly, a third optical coupler (a light emitter PC2A and a light receiver PC2B) is also provided, which is triggered to operate by the 12V voltage generated and a switch control pin VCC_ON/OFF of the charging management circuit 60. When the light receiver PC2B receives the light emitted by the light emitter PC2A, a collector of a transistor Q14 is connected to the base thereof, and the resistor R97 plays a negative feedback function to stabilize the Q point, so that the stability of the output voltage of the logic device power supply 70 is improved.

The power factor correction power supply and the logic device power supply 70 as shown in figures can be controlled by the charging management circuit 60 of STM32 series as shown in FIG. 4, and the corresponding connection relationships of the ends can be referred to the annotations of the pins in the figures, and ends with the same annotation refer to the ends required to be connected correspondingly.

In another aspect, a charging device is provided. The charging device includes the above overvoltage protection circuit and a charger. The charger includes a power factor correction power supply. An input end of the power factor correction power supply is configured to be connected to the power supply, and an output end of the power factor correction power supply is connected to the battery to be charged, which is configured to convert the voltage of the power supply to a charging voltage for charging the battery to be charged.

The descriptions of the overvoltage circuit, the configuration of each part and the relationship with the power factor correction power supply can be referred to the description of the above embodiments, which is not repeated here. The charging device provided in the present disclosure achieves the overvoltage protection by providing the above overvoltage protection circuit when the charger is in use, which improves the reliability and service life of the charging device.

In an embodiment, the charger further includes an LLC half-bridge resonant power supply and a charging interface.

An input end of the LLC half-bridge resonant power supply is configured to be connected to the output end of the power factor correction power supply, an output end of the LLC half-bridge resonant power supply is connected to an input end of a second switch in the normally open state, and an output end of the second switch is configured to be connected to a battery to be charged.

The charging interface is configured to be connected to the battery to be charged, and provided with a positive-and-negative-pole pin, an engage-enabled pin, and a charge-enabled pin; the length of the charge-enabled pin is smaller than the length of the positive-and-negative-pole pin and the engage-enabled pin, respectively. A set of ends of the positive-and-negative-pole pin are connected to a pair of output ends of the second switch correspondingly, and another set of ends of the positive-and-negative-pole pin is configured to be connected to the positive and negative poles of the battery to be charged correspondingly.

A first end of the charging management circuit is connected to an end of the engage-enabled pin, a second end of the charging management circuit is connected to an end of the charge-enabled pin, a third end of the charging management circuit is connected to a controlled end of the second switch, and a fourth end of the charging management circuit is connected to a burst mode operation threshold setting end of the LLC half-bridge resonant power supply.

During the process of plugging the charging interface into the battery to be charged, the charging management circuit is further configured to control the LLC half-bridge resonant power supply to soft start when the battery to be charged is in contact with the engage-enabled pin, and control the second switch to turn on when the other end of the charge-enabled pin of the charging interface is in contact with the battery to be charged, so as to make the LLC half-bridge resonant power supply to charge the battery to be charged.

During the process of unplugging the charging interface from the charging battery, the charging management circuit is configured to control a primary side of the LLC half-bridge resonant power supply to stop operating when the charge-enabled pin is disconnected from (i.e., is not in contact with) the battery to be charged. The charging battery refers to the battery to be charged in a charging state, which is used to distinguish the same battery in different state for power supply.

The charging device conducts the charging channel by providing the positive-and-negative-pole pin, the charge-enabled pin and the engage-enabled pin with different length, and the positive-and-negative-pole pin is configured to set up corresponding connection relationship between the LLC half-bridge resonant power supply and the positive and negative poles of the battery to be charged. Specifically, using the charging management capability, the first end of the charging management circuit is connected to an end of the engage-enabled pin, the second end of the charging management circuit is connected to an end of the charge-enabled pin, and the third end of the charging management circuit is connected to a controlled end of the first switch. When charging, since the charge-enabled pin is the shortest, the engage-enabled pin and the positive-and-negative-pole pin are firstly in contact with the battery. The positive-and-negative-pole pin is correspondingly connected to the positive and negative poles of the battery to be charged. When the battery is in contact with the engage-enabled pin, the electrical signal received by the first end of the charging management circuit connected to the other end of the engage-enabled pin is changed. When the charging management circuit detects this change, it controls the LLC half-bridge resonant power supply to soft start. During the soft start process of the LLC half-bridge resonant power supply, the charge-enabled pin contacts the battery later. The electrical signal received by the second end of the charging management circuit connected to the other end of the charge-enabled pin is changed under the effect of the battery. When the charging management circuit detects this change, the third end thereof outputs a signal, which applies to the controlled end of the first switch, to drive the first switch to be turned on. At this time, the output end of the LLC half-bridge resonant power supply charges the battery to be charged to achieve a charging soft start and zero-voltage connection.

When the charging process is completed, since the charge-enabled pin is the shortest, the charge-enabled pin is firstly removed from the battery during the process of unplugging the charging interface. At this time, the charging management circuit can detect the disconnection of the charge-enabled pin from the battery by the change of the signal received by the second end. At this time, the fourth end of the charging management circuit outputs a signal to the burst mode operation threshold setting end of the LLC half-bridge resonant power supply to trigger the primary side of the LLC half-bridge resonant power supply to stop operating. At this time, the engage-enabled pin and the positive-and-negative-pole pin are further disconnected from the battery. Since the primary side of the LLC half-bridge resonant power supply has stopped operating at this time, zero-current disconnection is achieved, thereby avoiding the oxidation problem of the contact surface caused by the arc generated during the hot plugging process, and further improving the service life and safety of the charging device. That is, the charging device provided by the embodiment of the present disclosure can not only achieve over-voltage protection, but also achieve the effect of suppressing arc generation during hot plugging process.

Figure 8:
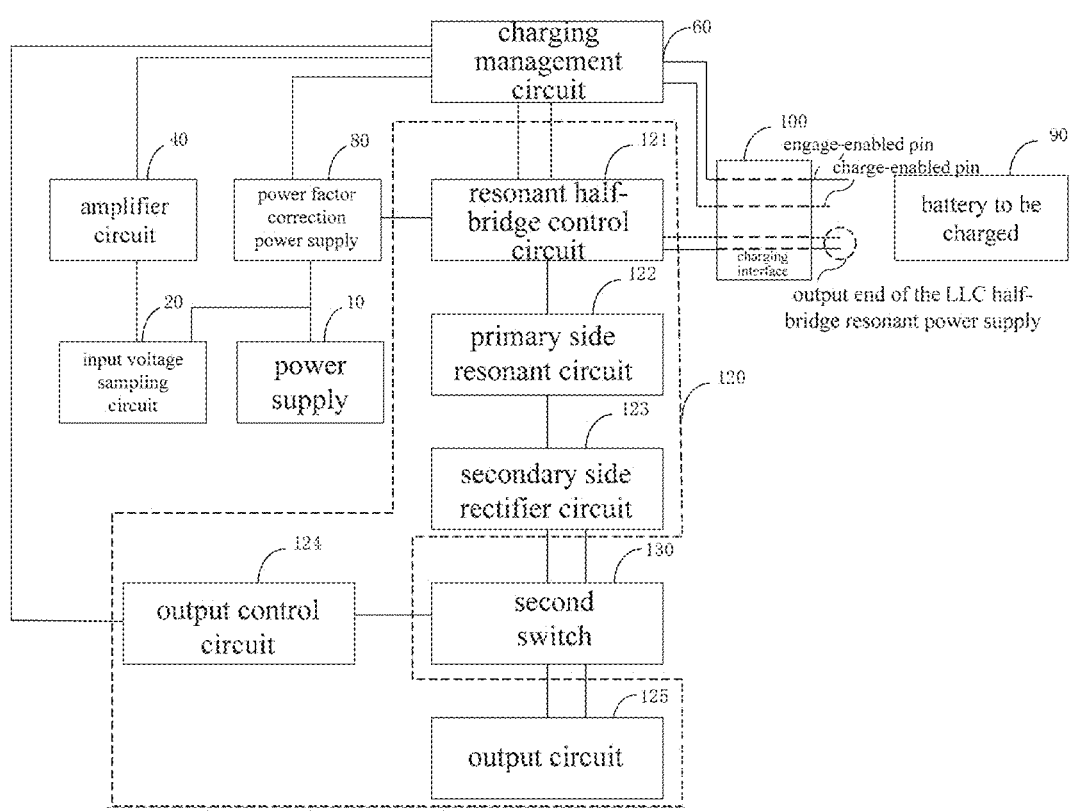
FIG. 8 is a circuit diagram of an overvoltage protection circuit and a charging device according to an embodiment.
Figure 9:
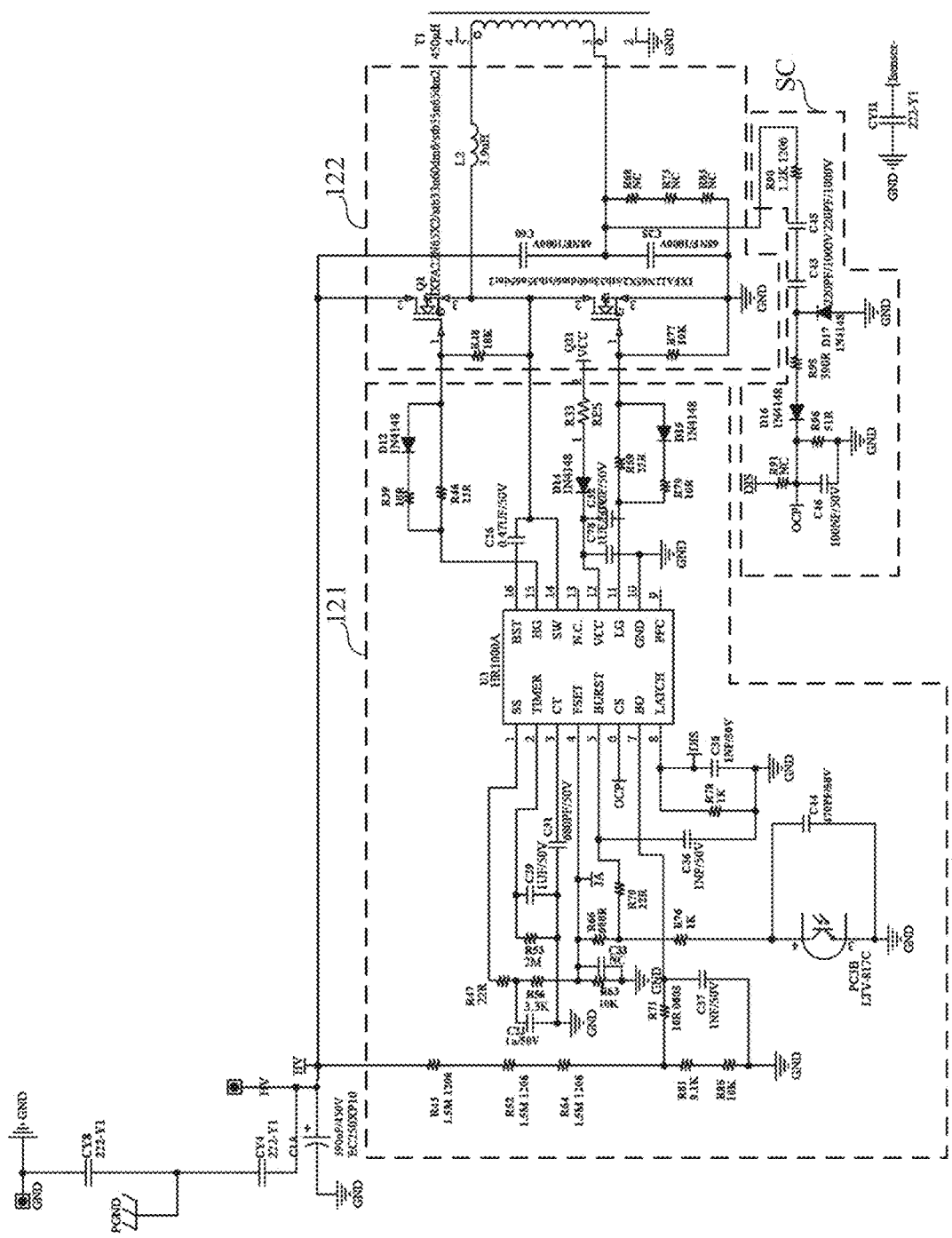
FIG. 9 is a circuit diagram of a primary side of an LLC half-bridge resonant power supply according to an embodiment.
Figure 10:
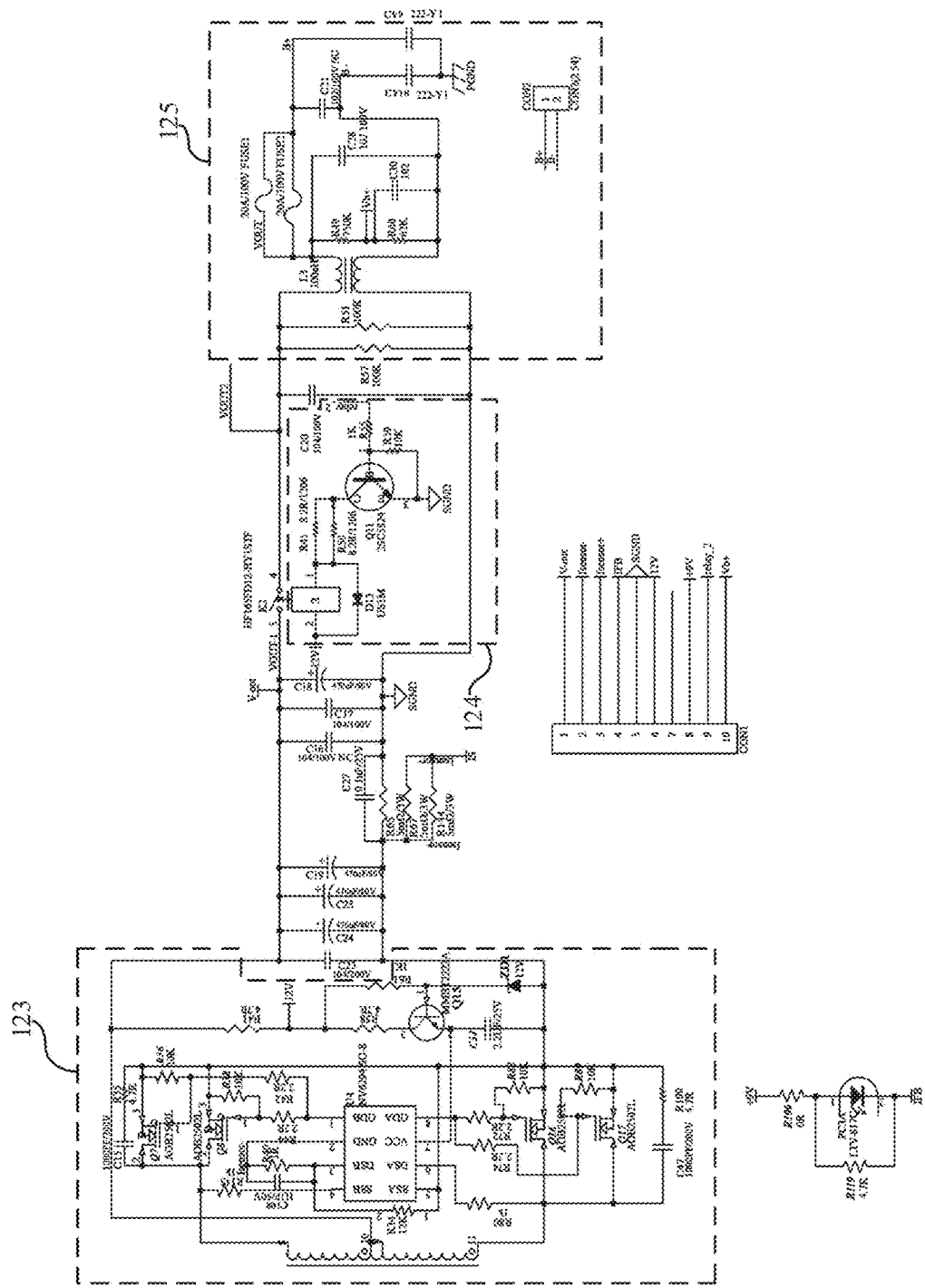
FIG. 10 is circuit diagram of a corresponding secondary side of the LLC half-bridge resonant power supply in FIG. 9.

In an embodiment, as shown in FIGS. 8 to 10, the LLC half-bridge resonant power supply 120 includes a resonant half-bridge control circuit 121, a primary side resonant circuit 122, a secondary side rectifier circuit 123, an output control circuit 124, and a charging output circuit 125. An input end of the resonant half-bridge control circuit 121 is configured to be connected to the power supply 10. An input end of the primary side resonant circuit 122 is configured to be connected to the power supply 10. A controlled end of the primary side resonant circuit 122 is connected to a control end of the resonant half-bridge control circuit 121. An input end of the secondary side rectifier circuit 123 is coupled to the primary side resonant circuit 122. An output end of the secondary side rectifier circuit 123 is connected to the input end of the second switch 130. A controlled end of the output control circuit 124 is connected to the third end of the charging management circuit 60. A control end of the output control circuit 124 is connected to a control end of the second switch 130. An end of the charging output circuit 125 is connected to the output end of the second switch 130, and another end of the charging output circuit 125 is configured to be connected to the battery 90 to be charged.

When the charging interface 100 and the output end of the LLC half-bridge resonant power supply 120 are connected with the battery 90 to be charged, the output end of the LLC half-bridge resonant power supply 120 can be integrated in the charging interface 100. The output end of the LLC half-bridge resonant power supply 120 sets up an electrical connection relationship with the battery to be charged through the positive-and-negative-pole pin in the charging interface 100, and the length of the charge-enabled pin is the shortest compared to the lengths of other pins in the charging interface 100. The charging management circuit 60 controls the resonant half-bridge control circuit 121 to operate when the engage-enabled pin is in contact with the battery. The on/off of a transistor in the primary side resonant circuit 122 is controlled by the resonant half-bridge control circuit 121. The secondary side rectifier circuit 123 is coupled to the primary side resonant circuit 122, and rectifies the voltage coupled by the secondary side to generate a DC power suitable for charging the battery. The DC power generated is transmitted to the output circuit 125 after passing through the second switch 130. Since the charge-enabled pin has not yet contacted the battery at the beginning, the second switch 130 is in an off state. At this time, the resonant half-bridge control circuit 121 performs the voltage conversion of the primary side resonant circuit 122 and the secondary side rectifier circuit 123 only in the soft start mode. When the charging interface 100 is plugged in tightly, the change of the signal received by the charge-enabled pin triggers the third end of the charging management circuit 60 to output a signal to the output control circuit 124, so that the output control circuit 124 drives the second switch 130 to be turned on. At this time, the DC power generated by the secondary side rectifier circuit 123 is transmitted to the output circuit 125 through the second switch 130, and the battery is charged through the positive-and-negative-pole pin in the charging interface 100 connected to the output end of the output circuit 125. The setup of the connection relationship of the positive and negative poles is earlier than the engagement of the charge-enabled pin.

In an embodiment, in order to improve the stability of the electrical signal output to the battery, a filter circuit is also connected in series to the output end of the secondary side rectifier circuit 123. For example, it can be a filter circuit composed of C23, C24, C25, and C26 as shown in FIG. 10. The output electrical signal of the secondary side rectifier circuit 123 is transmitted to an input end 5 of the second switch 130 (K2) after the output electrical signal is filtered, and then transmitted to an input end of the output circuit 125 through an output end 4 of the second switch 130 (K2). Positive and negative voltage signals (B+ and B−) are output at the output circuit 125, and B+ and B− can be applied to the battery 90 to be charged through a port CON2, as shown in FIG. 10. The port CON2 to which B+ and B− are applied can be integrated in the charging interface 100, which is convenient for the plugging and unplugging process when charging.

In an embodiment, as shown in FIGS. 9 to 10, the charging device further includes a fourth optical coupler PC3. A light emitter PC3A of the fourth optical coupler PC3 is connected to the fourth end Vpwm of the charging management circuit 60. A light receiver PC3B of the fourth optical coupler is connected to a burst mode operation threshold setting end BURST of the resonant half-bridge control circuit 121, respectively. During the process of unplugging the charging interface 100 from the battery 90 to be charged, the charging management circuit 60 is configured to, when the charge-enabled pin (connected with a pin 25 in FIG. 4) is disconnected from the battery 90 to be charged, output a signal (for example, outputs a low level) to be applied to the light emitter PC3A from the fourth end Vpwn of the charging management circuit 60, so as to cause the light emitter PC3A to operate, so that the burst mode operation threshold setting end BURST is pulled to a low level by the light receiver PC3B of the fourth optical coupler PC3 when receiving the light signal emitted by the light emitter PC3A. When the burst mode operation threshold setting end BURST is at a low level, the resonant half-bridge control circuit 121 enters an idle state to cause the primary side resonant circuit 122 to stop operating.

Based on the above direct or indirect relationship between the fourth optical coupler PC3 connected to the burst mode operation threshold setting end BURST of the resonant half-bridge control circuit 121 and the fourth end Vpwm of the charging management circuit 60, the charge-enabled pin is firstly disconnected from the battery 90 to be charged due to its short length during the process of unplugging the charging interface 100 from the battery 90 to be charged when the charging process is completed, and in the charging management circuit 60, the signal received by the second end connected to the charge-enabled pin jumps from a low level to a high level. At this time, the fourth end (which can be a Vpwm signal output by the pin 56 of the STM32 chip as shown in FIG. 4) of the charging management circuit 60 outputs a low level, which directly or indirectly applies to the cathode of the light emitter PC3A of the fourth optical coupler, to cause the light emitter PC3A of the fourth optical coupler PC3 to operate. After the light receiver PC3B of the fourth optical coupler receives the light signal emitted by the light emitter PC3A, the current flowing through the light receiver PC3B is changed, and the potential of the BURST end connected to an end of the light receiver PC3B is pulled to a low level (for example, the low level here may refer to that the potential to which the pin BURST is applied is lower than 1.25V), so as to turn off the driving operation of the resonant half-bridge control circuit 121, so that the resonant half-bridge control circuit 121 enters an idle state, and the primary side resonant circuit 122 stops operating.

In an embodiment, the resonant half-bridge control circuit 121 is an HR1000 model controller. Specifically, it can also be an HR1000A model controller. When the resonant half-bridge control circuit 121 of such model is selected, as shown in FIG. 9, its pin FSET is grounded through a resistor R66 and a resistor R76, and the lowest frequency of an oscillator is determined by the resistance of the resistor connected in series with the ground. The switching frequency of the resonant half-bridge control circuit 121 can be configured by connecting the fourth optical coupler PC3 and closing a feedback loop. The high and low configuration of the switching frequency achieves the output voltage regulation of the primary side resonant circuit 122. The pin FSET is also configured to be connected to a filter circuit composed of R63 and C33, which can ensure that excessive surge energy is prevented during startup and a soft start is achieved.

As shown in FIG. 9, the burst mode operation threshold setting end BURST of the resonant half-bridge control circuit 121 is connected to the resistor R66 connected to the pin FSET through the resistor R70, and the pin BURST is also connected in series with a capacitor C36 and then grounded. A pin LATCH of the resonant half-bridge control circuit 121 is connected to a latch trigger circuit SC connected to the primary side resonant circuit 122. For example, the latch trigger circuit SC may include a resistor R90, a resistor R91, a resistor R95, a resistor R96, a capacitor C43, a capacitor C45, a capacitor C46, a diode D16, and a diode D17 as shown in FIG. 9. An input end of the latch trigger circuit SC (an end of R90) is connected to the output end of the primary side resonant circuit 122. The voltage output from the output end of the primary side resonant circuit 122 is fed back to the pin LATCH of the resonant half-bridge control circuit 121. When an output voltage of an output pin DIS of the latch trigger circuit SC exceeds a pre-stored threshold value, the resonant half-bridge control circuit 121 is latched. For example, when the voltage received by the pin LATCH is greater than 1.85V, the resonant half-bridge control circuit 121 is turned off.

Figure 11:
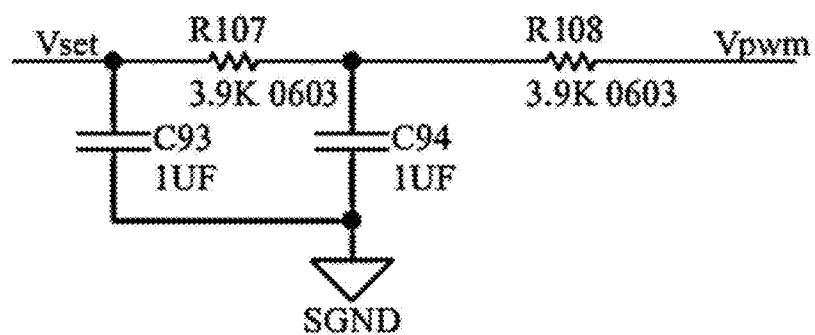
FIG. 11 is a schematic diagram of a voltage follower circuit according to an embodiment.
Figure 12:
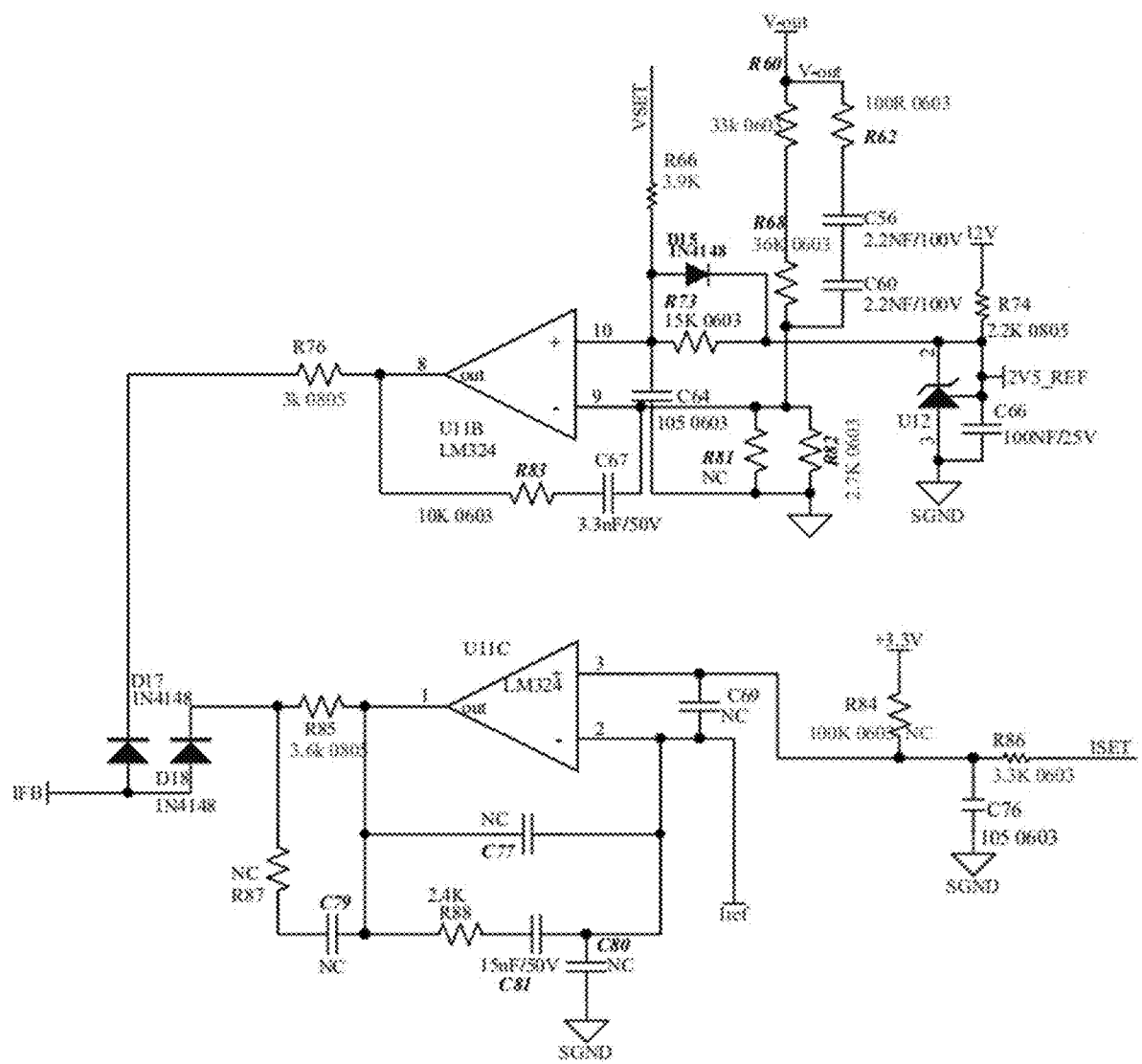
FIG. 12 is a schematic diagram of a feedback amplifier circuit according to an embodiment.

In an embodiment, the charging device further includes a voltage follower circuit as shown in FIG. 11 and a feedback amplifier circuit as shown in FIG. 12. An input end of the voltage follower circuit is connected to the fourth end of the charging management circuit 60, and the potential at an output end of the voltage follower circuit is the same as the potential to which the input end is applied. An input end of the feedback amplifier circuit is connected to the input end of the voltage follower circuit, and an output end of the feedback amplifier circuit is connected to the light emitter of the fourth optical coupler. A current follower circuit and the feedback amplifier circuit shown in FIG. 12 can also be used to realize that a pin Ipwm of the charging management circuit 60 in FIG. 4 outputs a low level to trigger the current follower circuit to output a low level to an end ISET in FIG. 12 when the charge-enabled pin of the charging interface 100 is removed from the battery 90, and potential at a port IFB is pulled down, so as to trigger the light emitter PC3A of the fourth optical coupler to emit light, so that the resonant half-bridge control circuit 121 is turned off, and the primary side stops operating.

The voltage follower circuit refers to a circuit whose input potential is the same as the output potential, and it is a circuit that functions as voltage follower and isolation. For example, it can be a circuit composed of a resistor R107, a resistor R108, a capacitor C93, and a capacitor C94 as shown in FIG. 11. An input end Vpwm of the circuit is an input end of the voltage follower circuit, and an end Vset is an output end of the voltage follower circuit. When the charging is completed and the charging interface 100 is disconnected from the battery, the charge-enabled pin is disconnected firstly. At this time, the fourth end of the charging management circuit 60 outputs a low level. Under the function of the low level, the output end Vset of the voltage follower circuit also outputs a low level to an input end of the feedback amplifier circuit, for example, it can be the pin VSET of the feedback amplifier circuit as shown in FIG. 12, and a low level is input to the pin VSET. At this time, an output end IFB of the feedback amplifier circuit also outputs a low level signal to the light emitter of the fourth optical coupler. After the light receiver of the fourth optical coupler receives the light emitted by the light emitter, the level of the pin BURST of the resonant half-bridge control circuit 121 is also pulled down to turn off the driving function of the resonant half-bridge control circuit 121. At this time, a primary side of the transformer T1 stops operating and no longer outputs electric energy to a secondary side thereof. The output current of the LLC half-bridge resonant power supply 20 quickly drops to zero. At this time, the connections between the engage-enabled pin and the port CON2 and the battery are disconnected respectively in order to achieve zero-current disconnecting operation. In this way, no arc is generated, and the pins of the charging device can be effectively protected from being oxidized due to the arc effect, so that the service life and safety of the charging device can be improved.

In an embodiment, as shown in FIG. 10, the second switch 130 is a relay, and the relay model in FIG. 10 can be used. As shown in FIG. 10, the above output control module 124 may include a second transistor. A base of the second transistor is connected to the third end of the charging management circuit 60, an emitter of the second transistor is grounded, and a collector of the second transistor is connected to a coil of the second switch 130. When the other end of the charge-enabled pin of the charging interface 100 is in contact with the battery 90 to be charged, the third end of the charging management circuit 60 outputs a high level to trigger the second transistor to be turned on. The collector of the second transistor triggers the coil to cause the second switch 130 to be turned on, and the LLC half-bridge resonant power supply 120 charges the battery 90 to be charged. In addition to the second transistor, the output control module 124 may further include a resistor R45, a resistor R50, a resistor R55, and a resistor R59 as shown in FIG. 10, and according to the connection relationship as shown in FIG. 10, they are connected to the third end relay_2 of the charging management circuit 60, and connected to each corresponding end of the second transistor as shown in the figure.

In an embodiment, as shown in FIG. 10, the charging output circuit 125 can include an LLC output filter circuit.

An input end of the LLC output filter circuit is connected to the output end of the second switch 130. For example, as shown in FIG. 10, the LLC output filter circuit includes a capacitor C20, a resistor R57, and a resistor R51. The voltage output from the output end of the second switch 130 (K2), after filtered by the LLC output filter circuit, can be buffered by an inductor L3 and then reaches a fuse protection circuit. An input end of the fuse protection circuit is connected to an output end of the LLC output filter circuit, and an output end of the fuse protection circuit is configured to be connected to the battery 90 to be charged. For example, as shown in FIG. 10, the fuse protection circuit may include a fuse FUSE1 and a fuse FUSE2 for over-current protection to avoid damage to the battery 90. In addition, the charging output module 125 may further include a resistor R49, a resistor R60, a capacitor C30, a capacitor C28, a capacitor C21, a capacitor CY10, and a capacitor CY9 as shown in FIG. 10. Positive voltage B+ and negative voltage B− are supplied to the battery 90 to be charged through the connections as shown in FIG. 10, and the charging efficiency is improved.

In an embodiment, as shown in FIG. 2, the charging device includes an input protection circuit between the input rectification filter circuit and the power supply 10. The input protection circuit may include a fuse F1 as shown in FIG. 2.

In addition, in some embodiments, the charging management circuit 60 of the charging device provided by the present disclosure may also be connected to a USB interface, and may also be connected to a cooling fan provided near the PFC power supply and the LLC half-bridge resonant power supply, so as to control the fan to operate for heat dissipation during the operation of the power supply. The charging device may further include a serial port of a model of such as RS485 for data interaction with other devices. For example, a new program can be burnt to the STM32 chip through the serial port. In addition, the charging device may further include a CAN interface connected to the charging management circuit 60. Under the control effect of the charging management circuit 60, the charging device can communicate with other devices through the CAN bus.

In the description of the present specification, the description of the reference terms "some embodiments", "other embodiments", "ideal embodiments" and the like means that the specific features, structures, materials or characteristics described in conjunction with the embodiments or examples are included in at least one embodiment or example of the present disclosure. In this specification, the schematic description of the above terms does not necessarily refer to the same embodiment or example.

The technical features of the above embodiments can be combined arbitrarily. In order to make the description concise, all possible combinations of the various technical features in the above embodiments are not described. However, as long as there is no contradiction in the combination of these technical features, they should be considered as the scope of this specification.

The above embodiments only express several embodiments of the present disclosure. The descriptions are more specific and detailed, but they should not be understood as limiting the scope of the disclosure. It should be pointed out that for those ordinary skilled in the art, without departing from the concept of the present disclosure, several modifications and improvements can also be made and these all fall within the protection scope of the present disclosure. Therefore, the protection scope of the present disclosure shall be subject to the appended claims.

What is claimed is:

1. An overvoltage protection circuit applied to a charger, comprising:
   an input voltage sampling circuit, an input end of the input voltage sampling circuit being configured to be connected in parallel to an input end of a power factor correction power supply of the charger, and the input end of the power factor correction power supply being further configured to be connected to a power supply for converting a voltage of the power supply to a charging voltage for charging a battery to be charged,
   an amplifier circuit, an input end of the amplifier circuit being connected to an output end of the input voltage sampling circuit,
   a charging management circuit, a sampling end of the charging management circuit being connected to an output end of the amplifier circuit, and the charging management circuit being configured to control the power factor correction power supply to operate when it is detected that a voltage output by the amplifier circuit is smaller than or equal to a preset voltage threshold, and
   a logic device power supply, connected to the input voltage sampling circuit, the amplifier circuit, and the charging management circuit respectively, and configured to supply an operating voltage to the input voltage sampling circuit, the amplifier circuit, and the charging management circuit.

2. The overvoltage protection circuit according to claim 1, further comprising:
   a first switch, an input end of the first switch being configured to be connected to the power supply, and an output end of the first switch being configured to be connected to the power factor correction power supply, and
   a first startup circuit, a controlled end of the first startup circuit being connected to a first delayed startup control end of the charging management circuit, and a control end of the first startup circuit being connected to a controlled end of the first switch;
   wherein the charging management circuit is configured to, when it is detected that the voltage output by the amplifier circuit is smaller than or equal to the preset voltage threshold, output a signal from the first delayed startup control end to drive the first startup circuit to control the first switch to be turned on, causing the power factor correction power supply to convert the voltage of the power supply to the charging voltage for charging the battery to be charged.

3. The overvoltage protection circuit according to claim 2, wherein the first switch is a relay, and the first startup circuit comprises a first transistor;
   wherein a base of the first transistor is connected to the first delayed startup control end of the charging management circuit, a collector of the first transistor is connected to an end of a coil of the first switch, an emitter of the first transistor is grounded, and another end of the coil of the first switch which is not connected to the first transistor is connected to the logic device power supply.

4. The overvoltage protection circuit according to claim 1, further comprising a second startup circuit, wherein:
a controlled end of the second startup circuit is connected to a first power operation control end of the charging management circuit, and a control end of the second startup circuit is connected to an operation state control end of the power factor correction power supply; and
the charging management circuit is further configured to, when it is detected that the voltage output by the amplifier circuit is smaller than or equal to a preset voltage threshold, output a signal from the first power operation control end to drive the power factor correction power supply to operate, causing the power factor correction power supply to convert the voltage of the power supply to the charging voltage for charging the battery to be charged.

5. The overvoltage protection circuit according to claim 4, the second startup circuit comprises a first optical coupler, wherein:
a cathode of a light emitter of the first optical coupler is connected to the first power operation control end of the charging management circuit, and an anode of the light emitter is connected to the logic device power supply;
an end of a light receiver of the first optical coupler is connected to the logic device power supply, and another end of the light receiver of the first optical coupler is configured to be connected to the operation state control end of the power factor correction power supply; and
the charging management circuit is further configured to, when it is detected that the voltage output by the amplifier circuit is smaller than or equal to the preset voltage threshold, output a signal from the first power operation control end to drive the light emitter of the first optical coupler to emit light, and the light receiver of the first optical coupler outputs current to the operation state control end of the power factor correction power supply under an optical coupling function so as to trigger the power factor correction power supply to output the charging voltage to the battery to be charged.

6. The overvoltage protection circuit according to claim 1, further comprising:
a capacitive reactance matching capacitor, connected in parallel at both ends of the first switch, and configured to achieve capacitive reactance matching and voltage division with a capacitor at an output end of the power factor correction power supply.

7. The overvoltage protection circuit according to claim 2, further comprising an input rectification filter circuit, wherein:
an input end of the input rectification filter circuit is connected to the output end of the first switch, and an output end of the input rectification filter circuit is configured to be connected to the output end of the power factor correction power supply.

8. The overvoltage protection circuit according to claim 7, further comprising an electromagnetic interference filter, wherein:

an input end of the electromagnetic interference filter is connected to the output end of the first switch, and an output end of the electromagnetic interference filter is connected to the input end of the input rectification filter circuit.

9. A charging device, comprising the overvoltage protection circuit according to claim 1 and a charger;
wherein the charger comprises:
the power factor correction power supply, the input end of the power factor correction power supply being configured to be connected to the power supply, and an output end of the power factor correction power supply being connected to the battery to be charged, and the power factor correction power supply being configured to convert the voltage of the power supply to a charging voltage for charging the battery to be charged.

10. The charging device according to claim 9, wherein the charger further comprises:
an LLC half-bridge resonant power supply, an input end of the LLC half-bridge resonant power supply being configured to be connected to the output end of the power factor correction power supply, and an output end of the LLC half-bridge resonant power supply being connected to an input end of a second switch in a normally open state, and
a charging interface, configured to be connected to the battery to be charged, and provided with a positive-and-negative-pole pin, an engage-enabled pin, and a charge-enabled pin, a length of the charge-enabled pin being smaller than the length of the positive-and-negative-pole pin and the engage-enabled pin, respectively, a set of ends of the positive-and-negative-pole pin being connected to a pair of output ends of the second switch correspondingly, and another set of ends of the positive-and-negative-pole pin being configured to be connected to positive and negative poles of the battery to be charged correspondingly;
wherein a first end of the charging management circuit is connected to an end of the engage-enabled pin, a second end of the charging management circuit is connected to an end of the charge-enabled pin, a third end of the charging management circuit is connected to a controlled end of the second switch, and a fourth end of the charging management circuit is connected to a burst mode operation threshold setting end of the LLC half-bridge resonant power supply;
the charging management circuit is further configured to, during a process of plugging the charging interface into the battery to be charged, control the LLC half-bridge resonant power supply to soft start when the battery to be charged is in contact with the engage-enabled pin, and control the second switch to be turned on to make the LLC half-bridge resonant power supply to charge the battery to be charged when another end of the charge-enabled pin of the charging interface is in contact with the battery to be charged; and
the charging management circuit is further configured to, during a process of unplugging the charging interface from the charging battery, when the charge-enabled pin is disconnected from the battery to be charged, control a primary side of the LLC half-bridge resonant power supply to stop operating.

* * * * *